(12) United States Patent
Sawhney

(10) Patent No.: US 7,359,258 B2
(45) Date of Patent: Apr. 15, 2008

(54) SEMICONDUCTOR MEMORY WITH WORDLINE TIMING

(75) Inventor: Ramandeep S. Sawhney, Richardson, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/581,927

(22) Filed: Oct. 17, 2006

(65) Prior Publication Data

US 2007/0047336 A1 Mar. 1, 2007

Related U.S. Application Data

(62) Division of application No. 11/338,937, filed on Jan. 25, 2006, which is a division of application No. 10/854,686, filed on May 26, 2004, now Pat. No. 7,042,775, which is a division of application No. 09/881,472, filed on Jun. 14, 2001, now Pat. No. 6,788,614.

(51) Int. Cl.
G11C 7/00 (2006.01)
G11C 7/10 (2006.01)
G11C 8/00 (2006.01)

(52) U.S. Cl. .............. 365/194; 365/189.08; 365/193; 365/196; 365/230.06

(58) Field of Classification Search ............ 365/191, 365/193, 194, 195, 196, 233, 230.03
See application file for complete search history.

(56) References Cited

U.S. PATENT DOCUMENTS

| | | | |
|---|---|---|---|
| 4,551,820 A | 11/1985 | Matsuura | |
| 4,571,705 A | 2/1986 | Wada et al. | |
| 4,789,967 A | 12/1988 | Liou et al. | |
| 4,833,653 A | 5/1989 | Mashiko | |
| 4,929,870 A | 5/1990 | Harju | |
| 5,079,742 A | 1/1992 | Simpson | |
| 5,132,931 A | 7/1992 | Koker | |
| 5,311,478 A | 5/1994 | Zagar et al. | |
| 5,311,481 A | 5/1994 | Casper et al. | |
| 5,313,431 A | 5/1994 | Uruma et al. | |
| 5,335,206 A | 8/1994 | Kawamoto | |
| 5,392,241 A | 2/1995 | Butler et al. | |
| 5,410,508 A | 4/1995 | McLaury | |
| 5,422,850 A | 6/1995 | Sukegawa et al. | |
| 5,459,846 A | 10/1995 | Hyatt | |
| 5,566,116 A | 10/1996 | Kang | |
| 5,586,080 A | 12/1996 | Raad et al. | |

(Continued)

OTHER PUBLICATIONS

Notice of Allowance and Fees Due mailed Jul. 6, 2007 in U.S. Appl. No. 11/581,926, 22 pages.

(Continued)

*Primary Examiner*—Ly Duy Pham
(74) *Attorney, Agent, or Firm*—Schwegman, Lundberg & Woessner, P.A.

(57) ABSTRACT

A semiconductor memory with wordline timing, which links activating a wordline to an isolation signal. The isolation signal is applied to a memory section adjacent the memory section containing the wordline to be activated. Upon such an isolation signal shifting low and isolating the adjacent memory section, a timing circuit triggers a wordline decoder to activate a select wordline. The timing circuit prevents activation of the wordline decoder until the isolation signal is received.

26 Claims, 7 Drawing Sheets

U.S. PATENT DOCUMENTS

| | | | |
|---|---|---|---|
| 5,612,918 A | 3/1997 | McClure | |
| 5,646,898 A | 7/1997 | Manning | |
| 5,703,832 A | 12/1997 | Ting et al. | |
| 5,719,820 A | 2/1998 | Fuji | |
| 5,726,596 A | 3/1998 | Perez | |
| 5,748,547 A | 5/1998 | Shau | |
| 5,774,412 A | 6/1998 | Raad et al. | |
| 5,790,462 A | 8/1998 | McClure | |
| 5,836,007 A | 11/1998 | Clinton et al. | |
| 5,838,990 A | 11/1998 | Park et al. | |
| 5,867,439 A | 2/1999 | Asakura et al. | |
| 5,870,343 A | 2/1999 | Chi et al. | |
| 5,898,636 A | 4/1999 | Isomura et al. | |
| 5,898,638 A | 4/1999 | Keeth | |
| 5,901,098 A | 5/1999 | Sim et al. | |
| 5,970,022 A | 10/1999 | Hoang | |
| 5,973,975 A | 10/1999 | Raad | |
| 5,982,682 A | 11/1999 | Nevill et al. | |
| 5,999,480 A | 12/1999 | Ong et al. | |
| 6,028,805 A | 2/2000 | Higuchi | |
| 6,028,806 A | 2/2000 | Waller | |
| 6,046,958 A | 4/2000 | Keeth | |
| 6,084,811 A | 7/2000 | Dorney | |
| 6,088,286 A | 7/2000 | Yamauchi et al. | |
| 6,091,659 A | 7/2000 | Watanabe et al. | |
| 6,101,197 A | 8/2000 | Keeth et al. | |
| 6,104,661 A | 8/2000 | Waller | |
| 6,107,134 A | 8/2000 | Lu et al. | |
| 6,118,713 A | 9/2000 | Raad | |
| 6,130,855 A | 10/2000 | Keeth | |
| 6,147,925 A * | 11/2000 | Tomishima et al. | 365/230.03 |
| 6,208,702 B1 | 3/2001 | Ghoshal | |
| 6,215,720 B1 | 4/2001 | Amano et al. | |
| RE37,176 E | 5/2001 | Kajigaya et al. | |
| 6,236,614 B1 | 5/2001 | Waller | |
| 6,295,593 B1 | 9/2001 | Hsu et al. | |
| 6,333,869 B1 | 12/2001 | Tanizaki et al. | |
| 6,349,072 B1 | 2/2002 | Origasa et al. | |
| 6,366,515 B2 | 4/2002 | Hidaka | |
| 6,445,632 B2 * | 9/2002 | Sakamoto | 365/205 |
| 6,449,204 B1 * | 9/2002 | Arimoto et al. | 365/222 |
| 6,477,098 B1 | 11/2002 | Raad | |
| 6,480,425 B2 * | 11/2002 | Yanagisawa et al. | 365/189.05 |
| 6,551,846 B1 * | 4/2003 | Furutani et al. | 438/17 |
| 6,563,758 B2 | 5/2003 | Shan | |
| 6,806,754 B2 | 10/2004 | Harrison et al. | |
| 6,836,166 B2 | 12/2004 | Lin et al. | |
| 6,888,776 B2 * | 5/2005 | Watanabe et al. | 365/230.06 |
| 7,042,775 B2 | 5/2006 | Sawhney | |
| 7,177,212 B2 | 2/2007 | Dudeck et al. | |
| 2001/0008492 A1 * | 7/2001 | Higashiho | 365/196 |
| 2002/0000837 A1 | 1/2002 | Keeth et al. | |
| 2004/0218444 A1 | 11/2004 | Sawhney | |
| 2006/0133164 A1 | 6/2006 | Sawhney | |
| 2007/0036013 A1 | 2/2007 | Sawhney | |

OTHER PUBLICATIONS

"U.S. Appl. No. 09-881472 Final office action mailed Feb. 4, 2003", 8 pgs.

"U.S. Appl. No. 09-881472 Non final office action mailed Aug. 14, 2002", 7 pgs.

"U.S. Appl. No. 09-881472 Notice of allowance mailed Apr. 26, 2004", 7 pgs.

"U.S. Appl. No. 10-854686 Non final office action mailed May 17, 2005", 10 pgs.

"U.S. Appl. No. 10-854686 Notice of allowance mailed Dec. 30, 2005", 8 pgs.

"U.S. Appl. No. 10-854686 Response filed Oct. 11, 2005 to Non final office action mailed May 17, 2005", 19 pgs.

"U.S. Appl. No. 11-338937 Non final office action mailed Nov. 1, 2006", 11 pgs.

"U.S. Appl. No. 11-338937 Notice of allowance mailed Feb. 6, 2007", 6 pgs.

"U.S. Appl. No. 11-338937 Notice of allowance mailed May 18, 2007", 5 pgs.

"U.S. Appl. No. 11-338937 Response filed Jan. 3, 2007 to Non final office action mailed Nov. 1, 2006", 11 pgs.

"Notice of Allowance mailed Oct. 18, 2007 U.S. Appl. No. 11/581,926", 5 pgs.

"Notice of Allowance mailed Sep. 13, 2007 U.S. Appl. No. 11/338937", 6 pgs.

* cited by examiner

SEMICONDUCTOR MEMORY WITH WORDLINE TIMING

This application is a Divisional of U.S. application Ser. No. 11/338,937, filed Jan. 25, 2006, which is a Divisional of U.S. application Ser. No. 10/854,686, filed on May 26, 2004, now U.S. Pat. No. 7,042,775, which is a Divisional of U.S. application Ser. No. 09/881,472, filed Jun. 14, 2001, now U.S. Pat. No. 6,788,614, which are incorporated herein by reference.

FIELD OF THE INVENTION

The present invention relates generally to semiconductor memory devices, and more specifically to wordline timing in semiconductor memory devices.

BACKGROUND OF THE INVENTION

Semiconductor memory devices such as dynamic random access memory (DRAM) devices are widely used in computers and other electronic devices. As the speed of such electronic devices increases, it is important that the speed of accessing data stored in the memory devices also increases or at least does not decrease as the density of the memory devices increases so that the electronic devices do not have to wait for data. Memory access speeds continue to increase as electronic device require greater amounts of data at increased delivery rates. Access speeds to DRAM devices are approaching 250 MHz and above. However, access speed may be limited by timing of memory access with other functions in the electronic device. The windows of time during which the memory is accessed decrease as the access speed increases. As a result, the length of time during which the memory device has to access the data stored therein (access window) has been reduced from the order of nanoseconds to picoseconds.

An enhancement of DRAM circuitry is the addition of isolation gates between the digit lines and a sense amplifier. Such isolation gates resistively separate the sense amplifier from the digit line capacitances. As a result, the sense amplifier latches data more quickly. The benefit of isolation gates is more significant for higher density DRAMs, which have longer digit lines, and thus higher digit line capacitances.

The isolation gates are controlled by a control signal which must be accurately timed in relation to other DRAM signals, such as the signal that activates the sense amplifier. There is a continuing need to supply DRAMs with greater memory capacity. As a result, the length of isolation gate control signal lines have increased. Accordingly, isolation signals experience an RC delay as the signals travel through the signal lines. If the timing of the control signal and other memory device signals are inaccurately timed, the sense amplifier may not operate as desired and errors will occur in reading the data from the memory device. Therefore, there is a need for a method to reduce timing inaccuracy and improve access speeds of DRAMS.

BRIEF DESCRIPTION OF THE DRAWINGS

The present invention is described with reference to the accompanying drawings. In the drawings, like reference numbers indicate identical or functionally similar elements.

DETAILED DESCRIPTION OF THE EMBODIMENTS

In the following detailed description of various embodiments of the present invention, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined by the appended claims and their equivalents.

Figure 1:
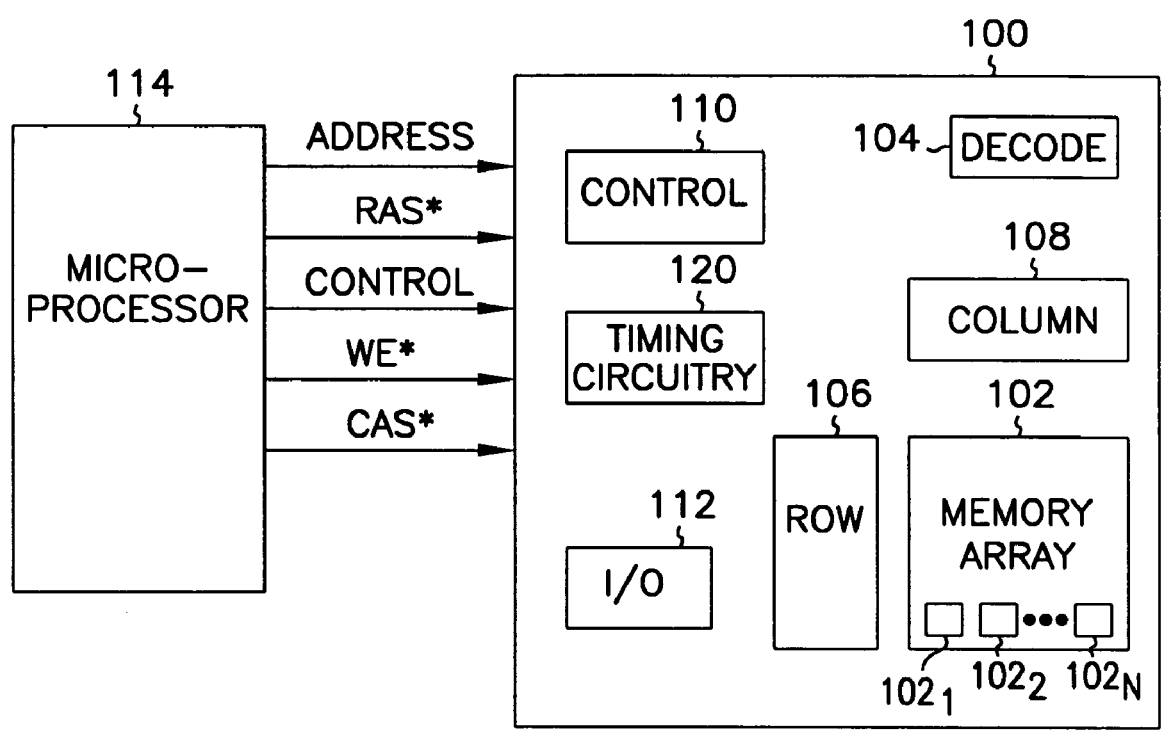
FIG. 1 is a block diagram of a device having a memory array according to the present invention.

FIG. 1 is a simplified block diagram of a memory device 100 according to one embodiment of the invention. The memory device 100, e.g. DRAM, includes an array of memory cells 102, address decoder 104, row decoder 106, column decoder 108, control circuitry 110, and Input/Output circuit 112. Control circuitry 110 is adapted to provide control signals for accessing the memory array 102. One such control signal is an ISO signal. In one embodiment, memory array 102 includes a plurality of sub-arrays or sections $102_1$, $102_2$, ... $102_N$. The memory device can be coupled to an external microprocessor 114, or memory controller for memory accessing functions, or other external circuitry. Memory device 100 receives control signals from the processor 114, such as WE*, RAS*, and CAS* signals. The memory is used to store data which is accessed via I/O lines. Memory device 100 has numerous memory arrays 102 or sub-arrays to increase the memory storage capacity and some of the arrays are relatively remote from a signal source. Memory device 100 further includes timing circuitry 120 that controls access to the memory array 102 such that possible errors in accessing the memory array 102 at an incorrect time are reduced. More particularly, timing circuitry 120 links accessing a selected memory location (cell) in memory array 102 to a signal that is physically adjacent the selected memory location. This improves the operation of memory device 100 by limiting access to selected memory locations until a signal adjacent selected memory array changes state. Specifically, the select memory array 102 is not accessed until the change in signal state propagates through a signal conducting line and is adjacent the selected memory array. Thus, precise timing of memory access is achieved which corrects for signal propagation delays, e.g. RC delays, in the signal conducting line.

In fast access time memory devices 100, access speeds equal at least 250 MHz. The timing windows in which the data in the memory device 100 is in the order of picoseconds. In contrast, prior timing windows are in the order of nanoseconds. The memory device according to the present invention has more precise timing for data access than prior memory devices.

It is known that signal lines in semiconductor ICs have differing RC delays so programming a fixed delay factor for each memory array 102 does not provide the precise timing required in fast memory devices. Additional control lines could be laid in the IC, however, this uses valuable space in the IC which could be more effectively used to increase the number of memory cells or reduce the overall size of the IC device. The present invention provides timing windows in the order of picoseconds for fast memory devices 100 by using the ISO signal to control access to the data in the memory array 102.

It will be appreciated by those skilled in the art that additional circuitry and control signals can, if necessary, be provided, and that the memory device of FIG. 1 has been simplified to help focus on the invention.

Timing circuitry 120 links access to the selected memory sub-array or selected memory cells in memory array 102 to a signal that has traveled through the IC and is physically adjacent the selected memory sub-array. Thus, the signal adjacent the memory sub-array and the signals which trigger access to the memory sub-array travel substantially similar distances in the integrated circuit memory device. While in memory devices with a small number of memory sub-arrays or relatively slow access times (less than 250 MHz), the propagation time of a signal is not typically a problem, in large memory arrays or fast access memory arrays (greater than 250 MHz) delays in signal propagation through the signal-carrying lines may cause errors in accessing and transmitting the data stored in the memory device. That is, the data access window for the memory array is not accurately controlled by conventional means to achieve data access windows in the order of picoseconds and errors in accessing data may occur. Accordingly, the present invention limits access to the memory location until after the signal adjacent the selected memory location changes state. This provides precise timing, and in fact a relatively constant time window, for accessing the data regardless of the location of the selected memory location on the IC.

Figure 2:
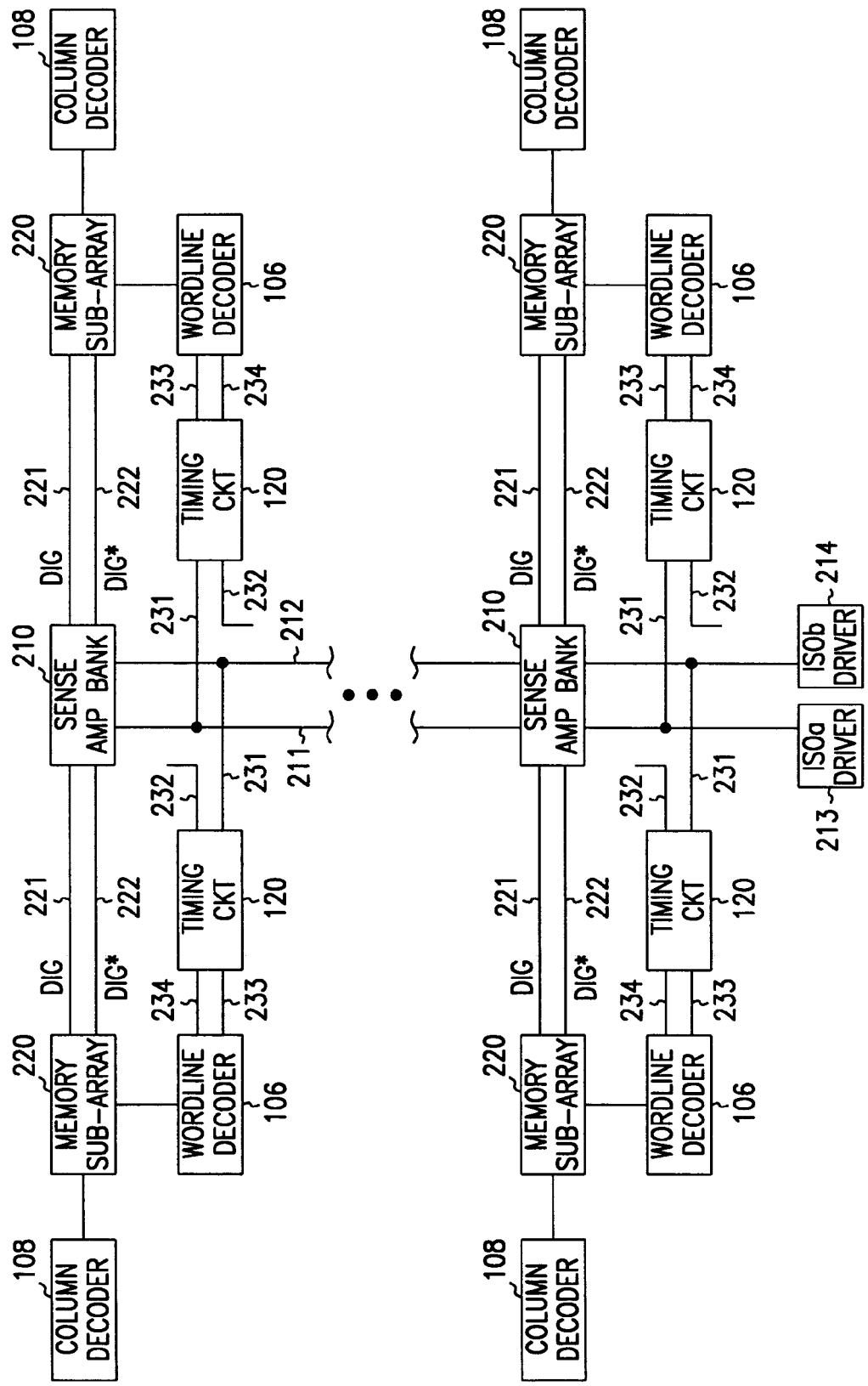
FIG. 2 is a block diagram of a memory array according to the present invention.

FIG. 2 shows a DRAM including a plurality of sense amplifier banks 210 connected together by isolation signal paths 211, 212. Isolation signal paths 211, 212 are connected to isolation signal drivers 213, 214, which one of ordinary skill will understand create isolation signals ISOa and ISOb respectively. As known to those of skill in the art, isolation signals bias a gate of an isolation transistor to at least partially isolate non-selected memory cells and/or other circuitry from the sense amplifiers in the sense amplifier banks 210 so that same can more easily sense the state of the selected memory cell. Some memory arrays include numerous memory cells (greater then 250 Mbytes), which are divided into a plurality of sub-arrays 220, each of which is connected to one sense amplifier bank 210. In the embodiment illustrated in FIG. 2, each sense amplifier bank 210 is connected to two memory sub-arrays 220 respectively through two pairs of digit and digit* lines 221, 222. The ISOa and ISOb signals operate to respectively isolate memory sub-arrays 220 depicted on the left or the right of the sense amplifier banks 210 in the FIG. 2 embodiment. When it is desired to access a selected memory cell in a memory sub-array 220, the row (wordline) and column decoders, 106 and 108, generate signals that connect the selected memory cell to the digit line 221 or digit* line 222.

One timing circuit 120 is connected between the isolation signal line 211 or 212 and the wordline decoder of each sub-array 220. Each timing circuit 120 includes a first input 231 connected to the isolation signal line 211 or 212 for isolating the group of memory sub-arrays 220 opposite the respective timing circuit 120. For example, timing circuitry 120 shown at the upper right in FIG. 2 is connected to ISOa signal line 211, which signal line isolates sense amplifiers 210 from circuitry (digit signal lines, digit* signal lines, memory sub-array, etc.) to left of sense amplifiers 210 as shown in FIG. 2. Timing circuit 120 shown on the left in FIG. 2 is connected to ISOb signal line 212, which signal line isolates sense amplifiers 210 from circuitry (digit signal lines, digit* signal lines, memory sub-array, etc.) to right of sense amplifiers 210 as shown in FIG. 2.

Each timing circuit 120 includes a second input 232. In one embodiment of the invention, the second input is RAS* signal. RAS* signal is a row access strobe signal which is known to those of skill in the art to be active as it transitions from high to low to latch the state of an address bus or address signal into a row address buffer. Timing circuit 120 produces on output signal 233 and 234 to trigger the wordline decoder 106 to access a select memory wordline in memory sub-array 220 and in conjunction with column decoder 108 a specific memory cell is accessed.

It is desirable to connect the timing circuit 120 to the respective signal line 211 or 212 physically adjacent the sense amplifier bank 210 which is connected to the same memory sub-array 220 as the timing circuit 120. Such connections links the accessing of the memory sub-array 220 to the change of state in the ISO signal which is isolating the sense amplifier bank 210 from the memory sub-array which are not being accessed. Accordingly, the activation of the wordline decoder 106 is dependent on the change of state of the ISO signal in the line 211 or 212 essentially at the same location as the gates which will be open circuited to isolates the sense amplifier banks from the circuitry associated with the non-accessed memory sub-arrays. One example of the time it takes the ISO signal to travel from the ISO driver 213 or 214 is in the range of about one to two nanoseconds. In a conventional memory device, the wordline decoder is activated as soon as the RAS* signal cycles low. If the RAS* signal cycles low before the ISO signal arrives to isolate the sense amplifier bank from a non-selected memory sub-array, then the sense amplifier bank may sense an incorrect signal and data corruption may occur. In the memory device 100 of the present invention, the timing circuit 120 receives the RAS* signal and the ISO signal, and activates the wordline decoder 106 only after both signals are received.

Figure 3:
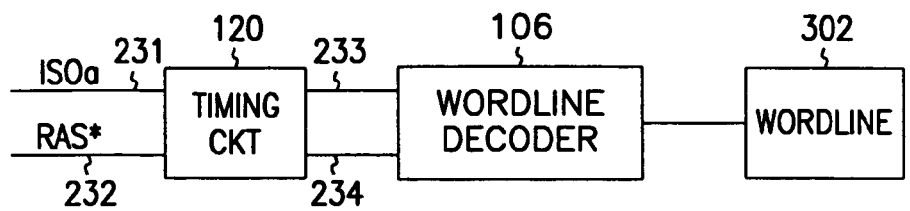
FIG. 3 is a diagram of a wordline decoder and a timing circuit according to the present invention.

FIG. 3 shows one embodiment of timing circuit 120 from FIGS. 1 and 2 which receives the ISOa signal and the RAS* signal as first and second inputs on respective signal lines 231 and 232, and produces output signals on signal lines 233 and 234 based on the state of the first and second inputs. Wordline decoder 106 receives signals from lines 233 and 234 as inputs. Wordline decoder 106 accesses a selected wordline 302 in memory sub-array based on the ISOa signal, the RAS* signal, and the address signals. One method and structure for addressing a memory cell is discussed in U.S. Pat. No. 5,410,508, which is assigned to the present Assignee and is herein incorporated by reference. The memory cells in the memory sub-array 220 associated with the wordline and the column, which is activated by column decoder, pull the digit and digit* lines to the values stored in the memory cells in a manner known to those of skill in the art.

Conventionally, a wordline decoder receives RAS* and assumes ISO is low. This assumption is based on the an estimate of the RC (parasitic) delay in the signal transmission. As a result, the decoder activates the addressed wordline regardless of the state of the ISO signal at a neighboring memory array. As illustrated herein, neighboring memory arrays are connected to the same sense amplifier bank as the target memory array connected to the wordline decoder. It will be understood that neighboring memory arrays are not limited to only those connected to the same sense amplifier bank. The present invention includes the timing circuit 120, which forces the wordline decoder 106 to wait until the RAS* signal and the ISO signal shift low. The ISO signal is the signal electrically decoupling a neighboring memory array from the sense amplifier bank. The present invention accordingly corrects for an ISO signal delays, which can corrupt data read from the addressed memory array.

Figure 4A:
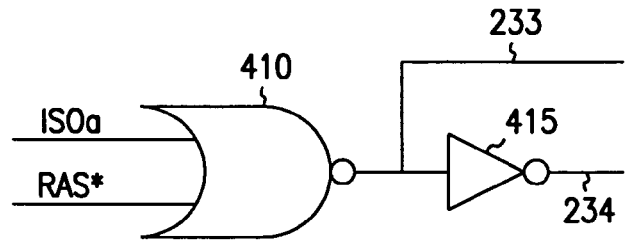
FIGS. 4A and 4B are embodiments of a timing circuit according to the present invention.

FIG. 4A shows one embodiment of timing circuit 120 according to the teachings of the present invention, which includes NOR gate 410. The NOR gate 410 receives ISOa and RAS* as inputs. Thus, when both ISOa and RAS* are low NOR gate 410 outputs a high signal on line 233, which is connected to the gate of p-channel transistor T1. The output of NOR gate 410 is also input to an invertor 415, which produces an output signal on line 234. As described above, the signal on line 234 is input into the wordline decoder 106.

Figure 4B:
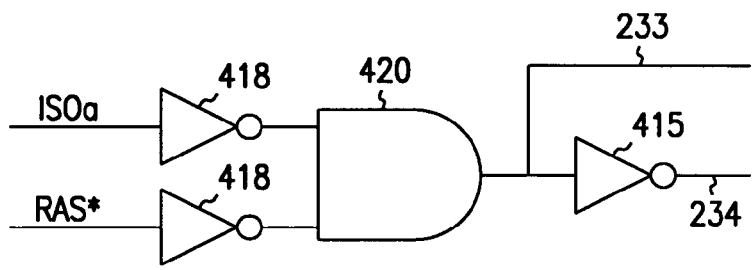

FIG. 4B shows another embodiment of timing circuit 120 according to the teachings of the present invention. This embodiment includes an AND gate 420. ISOa and RAS* are applied to invertors 418, which have their outputs connected to inputs of the AND gate 420. Gate 420 produces a high output when both the ISOa and RAS* are low. The output of gate 420 is applied as an output signal on line 233 and is also branched as an input to inverter 425 to create an output signal on line 234.

In some embodiments of timing circuit 120, the high signal on line 233 turns off a latch circuit in wordline decoder. The low signal on line 234 is fed to decoder circuit in the decoder 106.

It will be appreciated by one of skill in the art that timing circuit 120 can include other forms of logic circuits. Each of these other forms of logic circuits will receive input signals that will control when a wordline decoder will activate a wordline.

Figure 5:
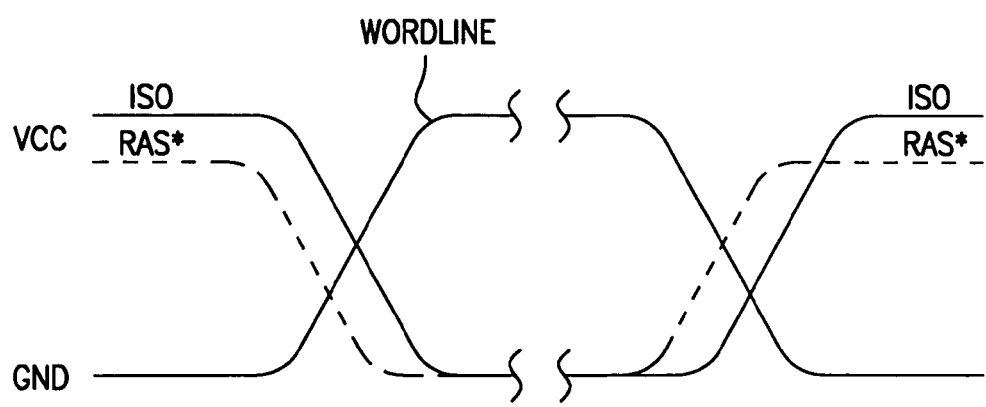
FIG. 5 is a timing diagram according to the present invention.

FIG. 5 shows a timing diagram according to the teachings of the present invention. As shown in FIGS. 2-4B, the activation of a specific wordline 302 depends upon the ISO signal shifting low. The ISO signal is the signal electrically decoupling one of the non-addressed memory sub-arrays from the sense amplifiers. In one embodiment, the ISO signal is read from one line 211 or 212 adjacent the isolation gate that decouples the non-addressed memory sub-array from the sense amplifier bank. The RAS* signal is applied to the memory device 100. The RAS signal typically arrives at the timing circuit 120 prior to the ISO signal. The wordline 302 is not accessed until the ISO signal shifts low. Hence, the timing circuit 120 awaits the ISO signal to shift low at the location to which its line 231 is attached to ISO signal line 211 or 212. Once the ISO signal shifts low, the timing circuit 120 produces wordline activation signals on lines 233, 234. Thus, the timing circuit 120 holding the wordline decoder in a non-active state, corrects for any propagation delay of the ISO signal through the memory device or electronic device. Examples of propagation delay include RC delays in lines 211, 212. Simply, timing circuit 120 forces wordline decoder 106 to wait until the isolation signal ISO shifts to low at a location physically adjacent the location of the sense amplifier bank 210 and/or the memory sub-array 220 in the memory device 100. Accordingly, data corruption due to the sense amplifier bank being connected to both the addressed memory sub-array and the non-addressed memory sub-array is reduced.

FIG. 5 further shows the timing for deactivating the wordline 302. As stated above, the RAS* signal typically arrives at timing circuit 120 before the ISO signal. Accordingly, the RAS* signal typically transitions from low to high at the timing circuit prior to the isolation signal transitioning high. Accordingly, after accessing the specific wordline 302, RAS* turns the wordline off by causing timing circuit 120 to turn off wordline decoder 106.

A brief description of various embodiments of structures, devices and systems in which the present invention may be incorporated follows. It will be recognized that the following are exemplary and are not exclusive of other structure, device, and systems in which the memory device according to present invention may be used.

Semiconductor Dies

Figure 6:
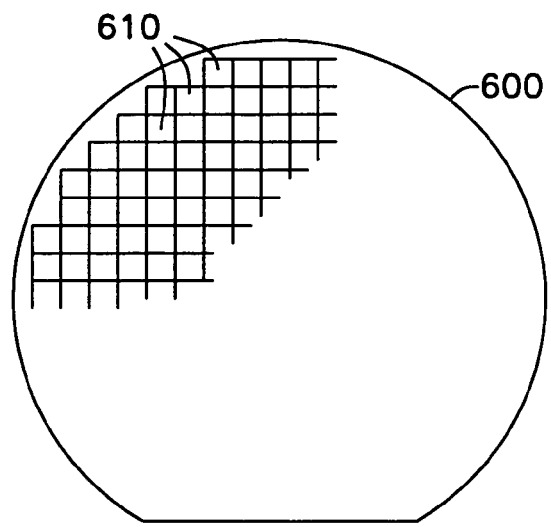
FIG. 6 is a view of a wafer containing semiconductor dies.

With reference to FIG. 6, for one embodiment, a semiconductor die 610 is produced from a wafer 600. A die is an individual pattern, typically rectangular, on a substrate that contains circuitry, or integrated circuit devices, to perform a specific function. At least one of the integrated circuit devices contains a memory with timing circuit in accordance with the invention. A semiconductor wafer will typically contain a repeated pattern of such dies containing the same functionality. At least one die 610 contains a timing circuit in accordance with the present invention, as discussed above. Die 610 may further contain additional circuitry to extend to such complex devices as a monolithic processor with multiple functionality. Die 610 is typically packaged in a protective casing (not shown) with leads extending therefrom (not shown) providing access to the circuitry of the die for unilateral or bilateral communication and control.

Circuit Modules

Figure 7:
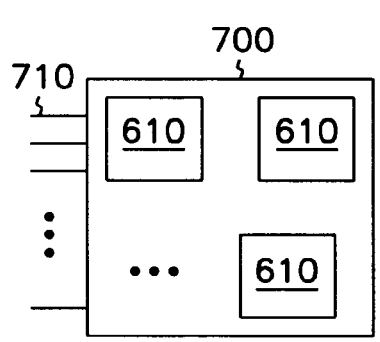
FIG. 7 is a block diagram of a circuit module.

As shown in FIG. 7, two or more dies 610 may be combined, with or without protective casing, into a circuit module 700 to enhance or extend the functionality of an individual die 610. Circuit module 700 may be a combination of dies 610 representing a variety of functions, or a combination of dies 610 containing the same functionality. One or more dies 610 of circuit module 700 contain at least one memory with timing circuit in accordance with the invention.

Some examples of a circuit module include memory modules, device drivers, power modules, communication modems, processor modules and application-specific modules, and may include multilayer, multichip modules. Circuit module 700 may be a subcomponent of a variety of electronic systems, such as a clock, a television, a cell phone, a personal computer, an automobile, an industrial control system, an aircraft and others. Circuit module 700 will have a variety of leads 710 extending therefrom and coupled to the dies 610 providing unilateral or bilateral communication and control.

Figure 8:
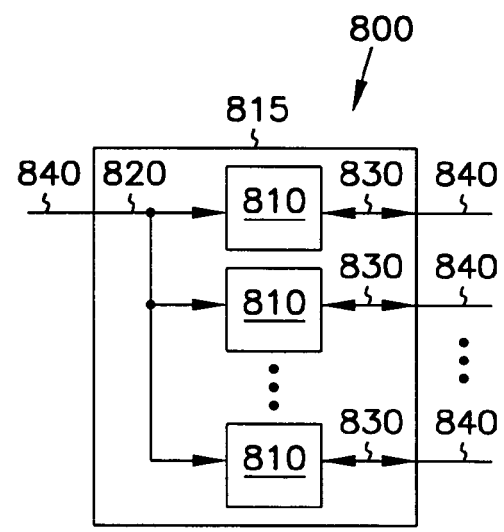
FIG. 8 is a block diagram of a memory module.

FIG. 8 shows one embodiment of a circuit module as memory module 800. Memory module 800 contains multiple memory devices 810 contained on support 815, the number generally depending upon the desired bus width and the desire for parity. Memory devices 810 include at least one memory with timing circuit according to the present invention. Memory module 800 accepts a command signal from an external controller (not shown) on a command link 820 and provides for data input and data output on data links 830. The command link 820 and data links 830 are connected to leads 840 extending from the support 815. Leads 840 are shown for conceptual purposes and are not limited to the positions shown in FIG. 8.

Electronic Systems

Figure 9:
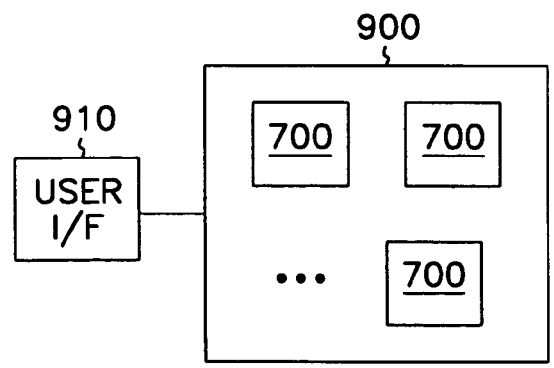
FIG. 9 is a block diagram of an electronic system.

FIG. 9 shows one embodiment of an electronic system 900 containing one or more circuit modules 700. At least one of the circuit modules 700 contains a timing circuit according to the present invention. Electronic system 900 generally contains a user interface 910. User interface 910 provides a user of the electronic system 900 with some form of control or observation of the results of the electronic system 900. Some examples of user interface 910 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 910 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 910, or of other information either preprogrammed into, or otherwise provided to, electronic system 900. As will be apparent from the lists of examples previously given, electronic system 900 will often be associated with certain mechanical components (not shown) in addition to circuit modules 700 and user interface 910. It will be appreciated that the one or more circuit modules 700 in electronic system 900 can be replaced by a single integrated circuit. Furthermore, electronic system 900 may be a subcomponent of a larger electronic system.

Figure 10:
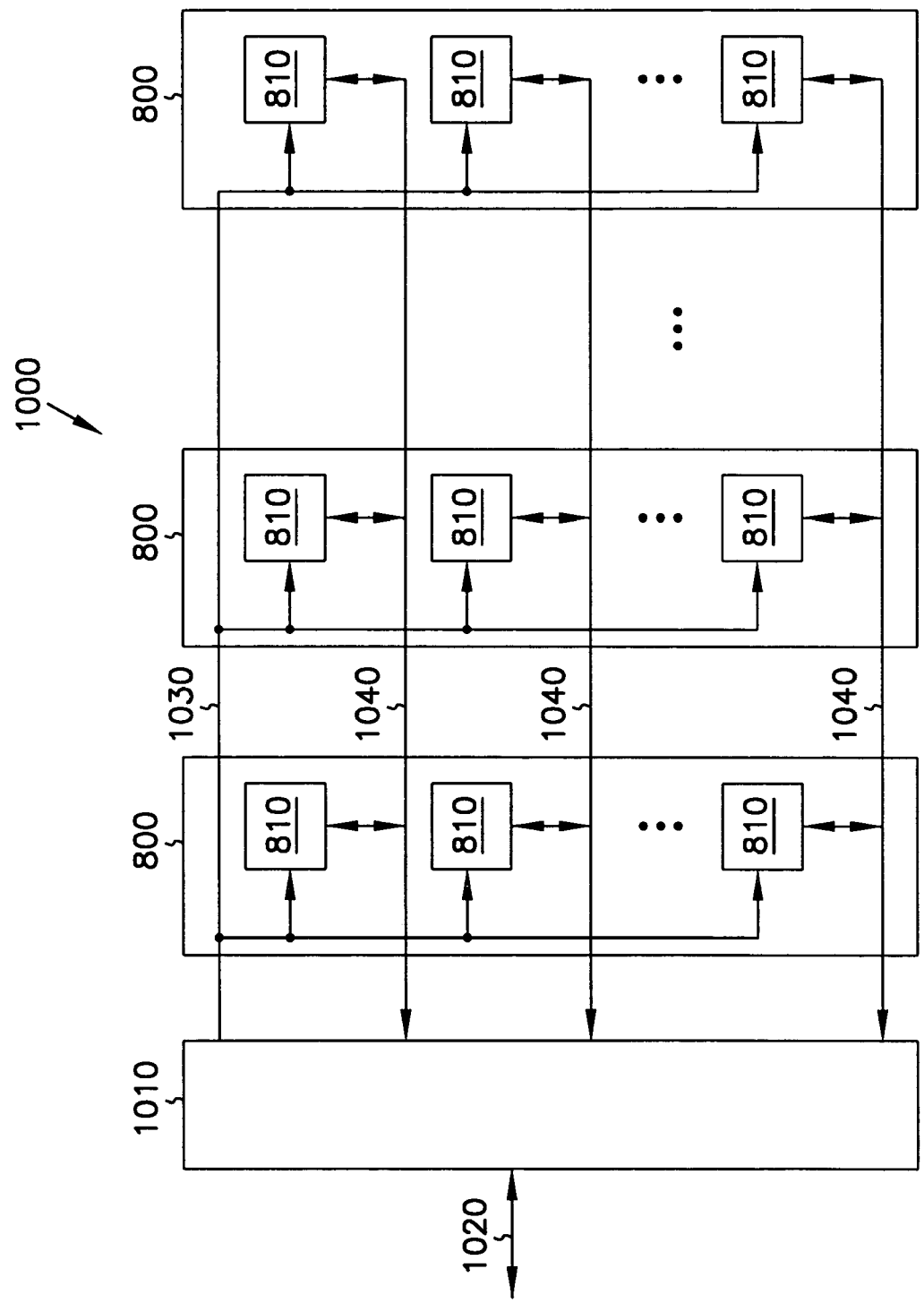
FIG. 10 is a block diagram of a memory system.

FIG. 10 shows one embodiment of an electronic system as memory system 1000. Memory system 1000 contains one or more memory modules 800 and a memory controller 1010. At least one of the memory modules 800 includes a timing circuit in accordance with the present invention. Memory controller 1010 provides and controls a bidirectional interface between memory system 1000 and an external system bus 1020. Memory system 1000 accepts a command signal from the external bus 1020 and relays it to the one or more memory modules 800 on a command link 1030. Memory system 1000 provides for data input and data output between the one or more memory modules 800 and external system bus 1020 on data links 1040.

Figure 11:
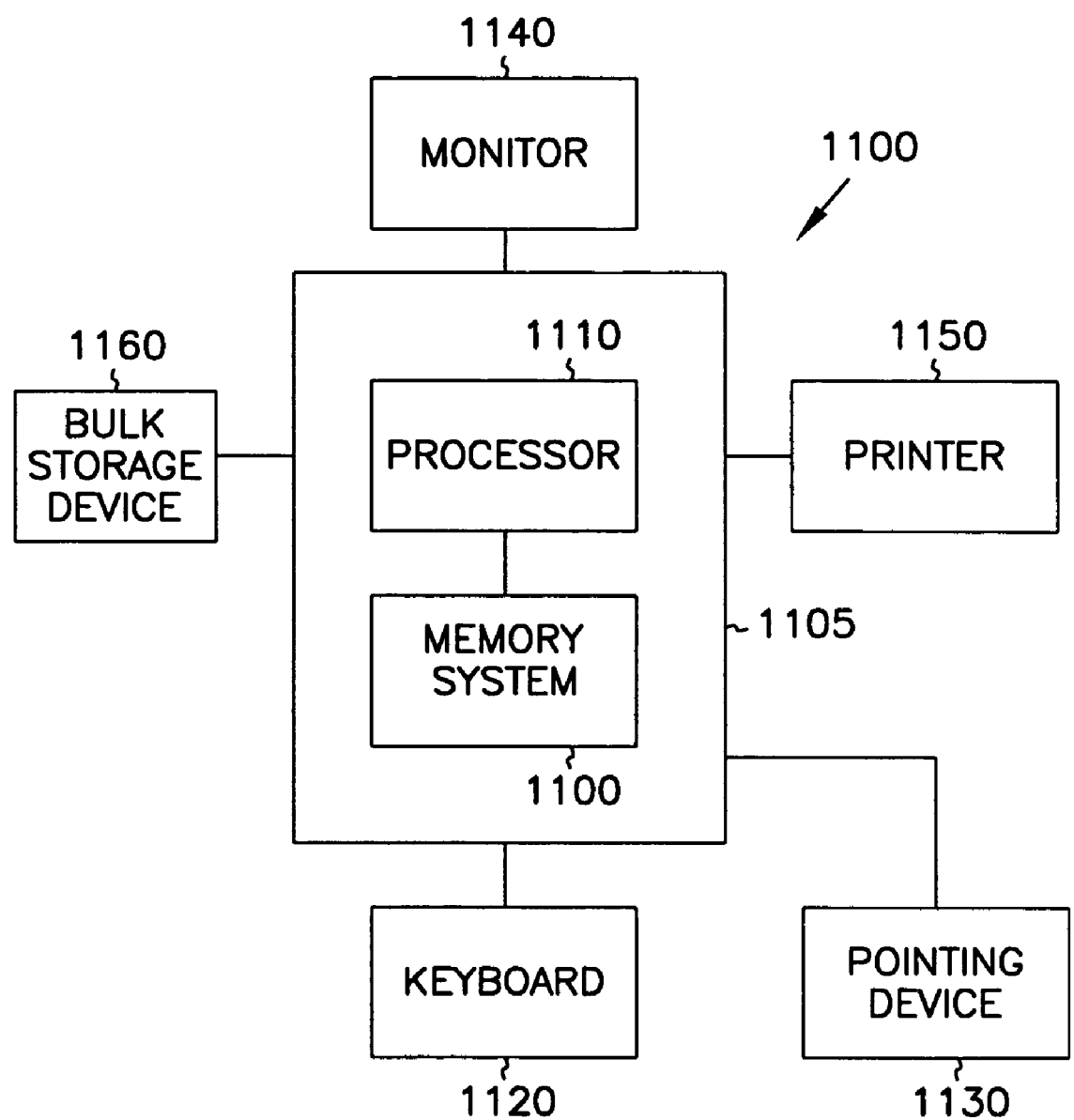
FIG. 11 is a block diagram of a computer system.

FIG. 11 shows a further embodiment of an electronic system as a computer system 1100. Computer system 1100 contains a processor 1110 and a memory system 1000 housed in a computer unit 1105. The memory system 1000 includes at least one of the timing circuits in accordance with the present invention. Computer system 1100 is but one example of an electronic system containing another electronic system, i.e., memory system 1000, as a subcomponent. Computer system 1100 optionally contains user interface components. Depicted in FIG. 11 are a keyboard 1120, a pointing device 1130, a monitor 1140, a printer 1150 and a bulk storage device 1160. It will be appreciated that other components are often associated with computer system 1100 such as modems, device driver cards, additional storage devices, etc. It will further be appreciated that the processor 1110 and memory system 1000 of computer system 1100 can be incorporated on a single integrated circuit. Such single package processing units reduce the communication time between the processor and the memory circuit.

Modification

Figure 12:
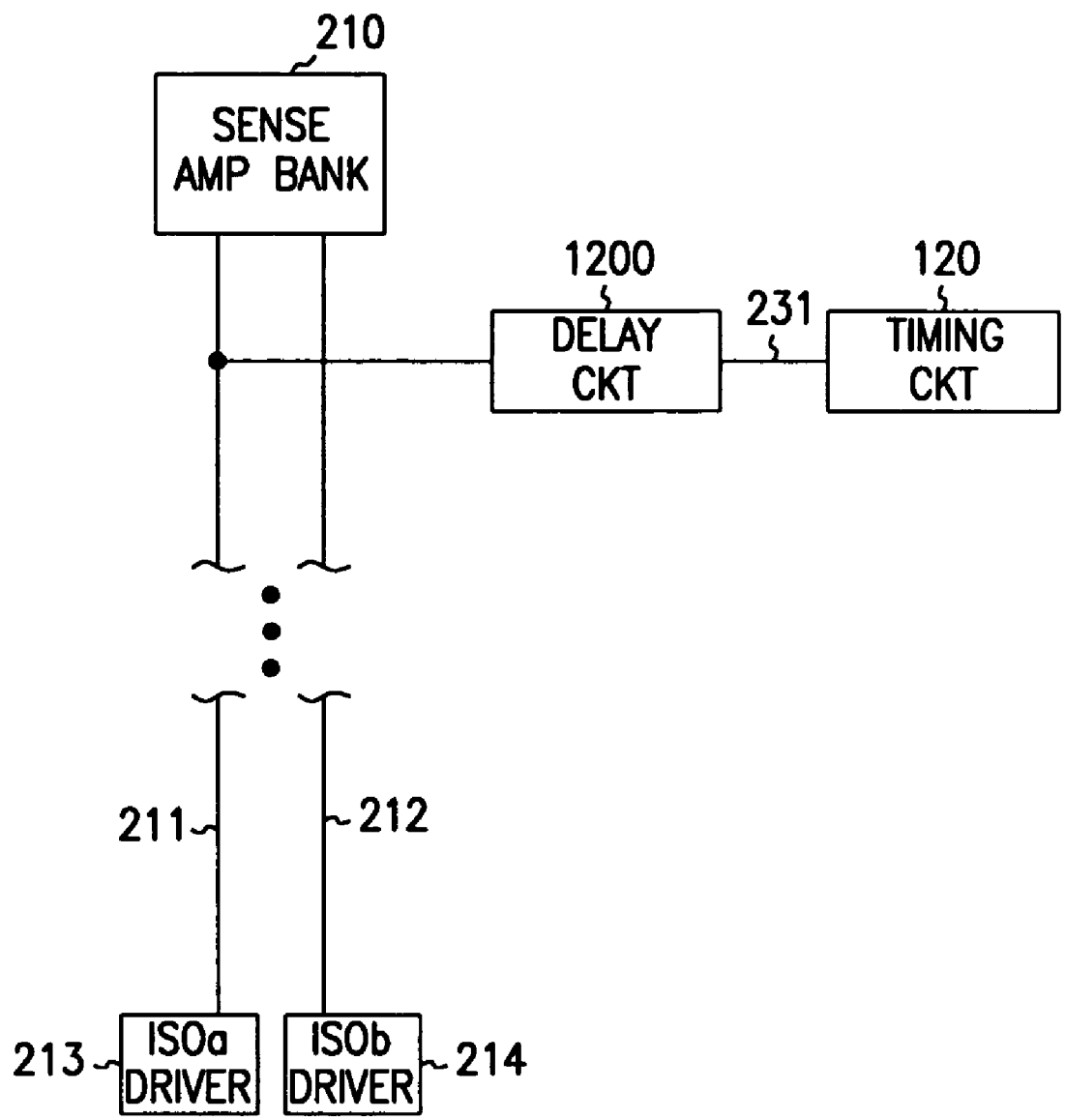
FIG. 12 is a diagram of a modified memory array according to another embodiment of the present invention.

FIG. 12 shows a further embodiment of the present invention, which is similar to the embodiment described above with reference to FIGS. 1-5, except that a delay circuit 1200 is inserted between the isolation signal line 211 and timing circuit 120. This allows the isolation signal (here ISOa) to be delayed before it is input into the timing circuit 120. In one embodiment, delay circuit 1200 is a programmable delay, which will allow the isolation signal to be delayed with a range of programmable delay times. The programmed delay time can be determined based on testing the memory device for accurate data access based on the propagation time of the ISO signal. If necessary, the delay can also be based on other signals required for accessing the wordline, column or memory location. Thereby, accuracy of data retrieved from the memory device, and/or processed by the electronic device attached thereto is achieved.

The above mentioned problems with memory devices and electronic devices incorporating memory devices therein, and other problems are addressed by the present invention and will be understood by reading and studying the specification.

Embodiments of the invention include a timing circuit linking activation of a memory decoder to a change of state of a control signal adjacent the memory array connected to the memory decoder. The timing circuitry reduces timing inaccuracies in accessing a selected memory location in the memory array.

In one embodiment, the timing circuitry is associated with a memory decoder, receives the control signal, and in response thereto activates the memory decoder to access select memory cells in the memory array. In another embodiment, the timing circuitry is associated with a wordline decoder. In another embodiment, the timing circuitry is connected to the isolation gate signal line adjacent a sense amplifier bank so as to reduce the effects of control signal propagation delay. In another embodiment, the timing circuitry receives both an isolation gate control signal and another signal thereby controlling memory access based on two inputs.

A further embodiment of the invention is a method for controlling a decoder based on a control signal for the isolation transistors.

Further features and advantages of the present invention, as well as the structure and operation of various embodiments of the present invention, are described in detail herein with reference to the accompanying drawings.

It should be noted that for many field effect transistors, the sources and drains are essentially interchangeable, and interconnections specified herein should not be interpreted as limited to those described. In addition, while some transistors were described as an n-channel or p-channel transistor, it is recognized by those skilled in the art that a p-channel or n-channel transistor may also be used.

It should be further noted that while the above disclosure focused on a timing circuit receiving the ISOa signal, the other timing circuits operate in a similar manner. For example, the timing circuits which receive ISOb signals operate in the similar manner as described above.

It is recognized that the present invention provides improved wordline timing by minimal additional circuitry being added to the IC. It is well known that adding additional elements, and in particular signal carrying lines, consumes valuable space on an IC. Such space is at a premium due to the continuing desire to increase memory storage without increasing the size of IC chips. The present invention improves wordline timing by tying wordline activation to a signal line that is already present at each section of memory on a chip. The timing circuit is connected to the ISO signal line. The timing circuit typically receives the RAS* signal first. Then, the timing circuit receives the ISO signal from a location on the ISO signal line. Once the ISO signal shifts low, the isolation gates connected to a neighboring memory array are isolated from the sense amplifier banks. The timing circuit activates the wordline decoder for the memory array which is addressed. In one embodiment, the sense amplifier bank is connected to both the addressed on non-addressed memory arrays. Accordingly, if the ISO signal does not isolate the non-addressed memory array before the wordline decoder activates the wordlines in the addressed array, then data corruption may occur. As discussed herein the timing circuit forces the wordline decoder to wait until the ISO signal is received. Thus, the non-addressed memory array is isolated from sense amplifier bank contemporaneously with the activation of the wordline decoder. As a result, data is not corrupted.

It will be understood that the description of a DRAM (Dynamic Random Access Memory) herein is intended to provide a general understanding of the memory and is not a complete description of all the elements and features of a DRAM. Further, the invention is equally applicable to any size and type of memory circuit utilizing isolation devices and is not intended to be limited to the DRAM described above. Alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is known in the art.

In conclusion, the present invention improves the performance of fast (greater than 250 MHz) memory devices and other memory devices having long signal transmission paths, for example in large size memory devices. The timing window for such fast memory devices is in the range of picoseconds. The wordline timing of a memory sub-array is dependant on the turning an isolation signal off to an adjacent memory sub-array that is not being accessed. The adjacent memory sub-array is located at essentially the same distance from the signal source as the memory sub-array that will be accessed. The delays inherent in the signal lines transmitting the signals in the memory device are, accordingly, corrected by linking wordline activation to a signal which must travel to a similar location on the memory device as the wordline that is being activated. As a result wordline operating speed is relative to the ISO signal at a location on a transmission line local to a section of a memory device where the wordline is being activated. This keeps a constant delta time margin between the ISO signal and wordline activation regardless of the location of the wordline on the memory device (IC chip).

The present invention corrects for variations in wordline timing. Conventional timing relies on estimates of signal transmission times through conductors in the integrated circuit. However, the RC time constants may vary from these estimates due to fabrication process variations, for example, process temperatures, non-uniform metal structures and compounds, other factors influencing fabrication, drive strength of p-channel or n-channel transistors, etc. Other factors that effect signal transmission times are operating temperatures of the device. The present invention provides internal timing that does not depend on such estimates and corrects for such variations. The present invention consequently improves operation of a memory device by reducing data corruption based on timing errors.

I claim:

1. A method of reducing data corruption in a memory device, comprising:
   providing a timing circuit in the memory device;
   connecting a wordline decoder to a memory array;
   linking activation of the wordline decoder to the timing circuit; and
   producing a wordline activation signal from the timing circuit based on a nearby ISO signal and a state of a row access signal, wherein producing a wordline activation signal includes correcting for ISO signal delays; and
   isolating a sense amplifier from the memory array until the wordline decoder is activated.

2. The method of claim 1, wherein producing the wordline activation signal includes relying on the physical arrival of the ISO signal and not on an estimate of the arrival of the ISO signal.

3. The method of claim 1, wherein the row access signal is associated with a portion of the memory array different than the ISO signal.

4. The method of claim 1, wherein producing the word line activation signal includes activating the wordline decoder regardless of the state of an ISO signal at a neighboring memory array.

5. The method of claim 1, wherein producing an activation signal includes waiting until the ISO signal and the row access signal reach a wordline activation state.

6. A method of reducing data corruption in a memory device, comprising:
   providing a timing circuit in the memory device;
   connecting a wordline decoder to a memory array;
   connecting the wordline decoder to the timing circuit; and
   waiting until an ISO signal and a row access signal achieve wordline activation states before activating the wordline decoder, wherein waiting until the ISO signal and the row access signals achieve active states corrects for any propagation delay of the ISO signal; and
   isolating a sense amplifier from the memory array until the wordline decoder is activated.

7. The method of claim 6, wherein waiting until an ISO signal and a row access signal achieve wordline activation states includes waiting for the physical arrival of the ISO signal and not on an estimate of the arrival of the ISO signal.

8. The method of claim 7, wherein the row access signal is associated with a portion of the memory array different than the ISO signal.

9. The method of claim 6, wherein activating the wordline includes activating regardless of the state of an ISO signal at a neighboring memory array.

10. A method of reducing data corruption in a memory device, comprising:
    connecting a memory array to a sense amplifier bank;
    connecting a wordline decoder to the memory array; and isolating the memory array from the sense amplifier bank using the wordline decoder until both an ISO signal and RAS* signal achieve wordline activation states, wherein isolating includes correcting any propagation delay of the ISO signal and waiting for the physical arrival of the ISO signal and not on an estimate or the arrival of the ISO signal.

11. The method of claim 10, wherein the row access signal is associated with a portion of a memory array different than the ISO signal.

12. A timing circuit, comprising:
a delay circuit connected to a sense amplifier isolation signal line;
a first input connected to the delay circuit;
a second input adapted to receive at least one input signal; and
an output based on the first input and the second input and connected to an address decoder, wherein the timing circuit activates the address decoder based on the first input signal the second input signal, wherein the programmable delay is within a range of programmable delay times that represent propagation times of a sense amplifier isolation signal on the sense amplifier signal line.

13. The timing circuit of claim 12, wherein the first input signal includes an ISO signal.

14. The timing circuit of claim 12, wherein the second input signal includes an RAS* signal.

15. The timing circuit of claim 12, wherein the timing circuit activates the address decoder when the first input signal and the second input signal reach an activation state.

16. The timing circuit of claim 12, wherein the delay circuit includes a programmable delay.

17. The timing circuit of claim 12, wherein the delay circuit is adapted to produce a delay based on a propagation time of an isolation signal.

18. The timing circuit of claim 12, wherein the delay circuit is adapted to produce a delay based on a signal required for accessing a wordline, column or memory location in a memory device.

19. A memory device, comprising:
a plurality of memory cells coupled to digit lines;
a sense amplifier;
a plurality of isolation gates coupled between the sense amplifier and the digit lines, the isolation gates being controlled by isolation signals;
a delay circuit connected to one of the plurality of isolation gates;
a timing circuit connected to the delay circuit; and
a wordline decoder connected to the timing circuit and at least one of the memory cells,
wherein the timing circuit triggers the wordline decoder upon a state change in isolation signal at the one isolation gate, and wherein the delay circuit includes a programmable delay, wherein the programmable delay is within a range of programmable delay times that represent propagation times of a sense amplifier isolation signal on the sense amplifier signal line.

20. The memory device of claim 19, wherein the delay circuit is adapted to produce a delay based on a propagation time of an isolation signal.

21. The memory device of claim 19, wherein the delay circuit is adapted to produce a delay based on a signal required for accessing a wordline, column or memory location in a memory device.

22. A method of reducing data corruption in a memory device, comprising:
linking activation of a wordline decoder to a timing circuit;
producing a wordline activation signal from the timing circuit based on a nearby ISO signal and a state of a row access signal, wherein producing the wordline activation signal includes activating regardless of the state of an ISO signal at a neighboring memory array, and wherein the row access signal is associated with a portion of a memory array different than the ISO signal; and
isolating a sense amplifier from the memory array until the wordline decoder is activated.

23. The method of claim 22, wherein producing the wordline activation signal includes relying on the physical arrival of the ISO signal and not on an estimate of the arrival of the ISO signal.

24. The method of claim 22, wherein producing a wordline activation signal includes correcting for ISO signal delays.

25. A method of reducing data corruption in a memory device, comprising:
connecting a wordline decoder to a timing circuit;
waiting until an ISO signal and a row access signal achieve wordline activation states before activating the wordline decoder, wherein the row access signal is associated with a portion of a memory array different than the ISO signal;
activating the wordline decoder, wherein activating the wordline decoder includes activating regardless of the state of an ISO signal at a neighboring memory array; and
isolating a sense amplifier from the memory array until the wordline decoder is activated.

26. The method of claim 25, wherein waiting until an ISO signal and a row access signal achieve wordline activation states includes waiting for the physical arrival of the ISO signal and not on an estimate of the arrival of the ISO signal.

* * * * *

UNITED STATES PATENT AND TRADEMARK OFFICE
CERTIFICATE OF CORRECTION

PATENT NO. : 7,359,258 B2 Page 1 of 1
APPLICATION NO. : 11/581927
DATED : April 15, 2008
INVENTOR(S) : Sawhney It is certified that error appears in the above-identified patent and that said Letters Patent is hereby corrected as shown below:

In column 11, line 20, in Claim 12, delete "signal the" and insert -- signal and the --, therefor.

Signed and Sealed this

Twenty-fifth Day of November, 2008

JON W. DUDAS
*Director of the United States Patent and Trademark Office*